(12) United States Patent (10) Patent No.: US 7,714,407 B2
Udrea et al. (45) Date of Patent: May 11, 2010

(54) SEMICONDUCTOR DEVICE AND METHOD OF FORMING A SEMICONDUCTOR DEVICE

(75) Inventors: Florin Udrea, Cambridge (GB); Cerdin Lee, Cambridge (GB)

(73) Assignee: Cambridge Semiconductor Limited, Cambridge (GB)

( * ) Notice: Subject to any disclaimer, the term of this patent is extended or adjusted under 35 U.S.C. 154(b) by 363 days.

(21) Appl. No.: 11/847,201

(22) Filed: Aug. 29, 2007

(65) Prior Publication Data

US 2009/0057831 A1 Mar. 5, 2009

(51) Int. Cl.
*H01L 29/00* (2006.01)
*H01L 21/8238* (2006.01)
(52) U.S. Cl. .................. 257/501; 257/339; 257/487; 257/491; 257/496; 257/506; 257/E29.006; 257/E29.014; 257/E29.02; 438/221; 438/296; 438/424
(58) Field of Classification Search .......... 257/333, 257/339, 487, 491, 496, 500, 501, 506, E29.006, 257/E29.014, E29.02; 438/218, 221, 225, 438/294, 296, 297, 424, 439
See application file for complete search history.

(56) References Cited

U.S. PATENT DOCUMENTS

| | | | |
|---|---|---|---|
| 6,445,038 B1 * | 9/2002 | Tihanyi | 257/347 |
| 6,703,684 B2 | 3/2004 | Udrea | |
| 6,900,518 B2 | 5/2005 | Udrea | |
| 6,927,102 B2 | 8/2005 | Udrea | |
| 7,235,439 B2 | 6/2007 | Udrea | |
| 2005/0242368 A1 | 11/2005 | Udrea | |

FOREIGN PATENT DOCUMENTS

WO 02/25700 3/2002

OTHER PUBLICATIONS

Hamza Yilmaz, "Optimization and. Surface Charge Sensitivity of High-Voltage Blocking Structures with Shallow Junctions", IEEE Transactions on Electron Devices, vol. 38, No. 7, Jul. 1991, pp. 1666-1675.
Temple et al., "Junction. Termination. Extension. for. Near-Ideal Breakdown Voltage in p-n Junctions", IEEE Transactions on Electron Devices, vol. ED-33, No. 10, Oct. 1986, pp. 1601-1608.

* cited by examiner

*Primary Examiner*—Matthew E Warren
(74) *Attorney, Agent, or Firm*—Pillsbury Winthrop Shaw Pittman, LLP

(57) ABSTRACT

A high voltage/power semiconductor device has a semiconductor layer having a high voltage terminal end and a low voltage terminal end. A drift region extends between the high and low voltage terminal ends. A dielectric layer is provided above the drift region. An electrical conductor extends across at least a part of the dielectric layer above the drift region, the electrical conductor being connected or connectable to the high voltage terminal end. The drift region has plural trenches positioned below the electrical conductor. The trenches extend laterally across at least a part of the drift region in the direction transverse the direction between the high and low voltage terminal ends of the semiconductor layer, each trench containing a dielectric material. The trenches improve the distribution of electric field in the device in the presence of the electrical conductor.

19 Claims, 15 Drawing Sheets

SEMICONDUCTOR DEVICE AND METHOD OF FORMING A SEMICONDUCTOR DEVICE

The present invention relates to a semiconductor device and to a method of forming a semiconductor device.

The present invention is particularly concerned with high voltage semiconductor devices which can be used in power integrated circuits and is particularly concerned with lateral field-effect transistors, such as power LDMOSFETs, lateral insulated gate bipolar transistors (LIGBTs) and other types of power devices such as diodes, transistors and thyristors.

Power devices operated in integrated circuits typically operate with a voltage in the range 20V to 1.2 kV and typically higher than 30V or 50V or so. Power devices typically operate with a current in the range 10 mA to 50 A and typically higher than 0.1 A and smaller than 5 A. Such devices may also be referred to as "high voltage/power devices". These devices are typically capable of delivering from a few mWatts to 1 Watt or even a few tens of Watts of power. Their application may range from domestic appliances, electric cars, motor control, and power supplies to RF and microwave circuits and telecommunication systems.

Lateral devices in integrated circuits have the main terminals (variously called the anode/cathode, drain/source and emitter/collector) and the control terminals (termed the gate or base) placed at the surface of the device in order to be easily accessible. In power ICs, such devices are often monolithically integrated with CMOS-type or BiCMOS-type low voltage/low power circuits. It is desirable that one or several high voltage/power devices be integrated within the same chip.

It is known that the distribution of the electric field inside a depletion region in a semiconductor device is significantly changed when a high voltage track or interconnect traverses that depletion region. For example, referring to FIG. 1, in a simple diode 1 with no high voltage track or interconnect of this type, the voltage between the high voltage end 2 and the low voltage end 3 is spread uniformly across the dielectric layers 4,5,6 in the longitudinal direction between the high voltage terminal end 2 and the low voltage terminal end 3. Similarly, referring to FIG. 2, in a simple high voltage diode 1 with no high voltage track, the voltage is spread uniformly from the high voltage end 2 to the low voltage end 3. Being a high voltage device, a lowly doped semiconductor layer forming a drift layer or region 7 is provided between the high voltage end 2 and the low voltage end 3, positioned between lower and upper dielectric layers 4,6. The electric field will have a triangular or trapezoidal distribution depending on the doping arrangement of the drift region 7.

On the other hand, referring to FIG. 3 which shows a simple high voltage diode 1 with a metal high voltage track or interconnect 8 connected to the high voltage terminal end 2 and extending across the upper dielectric layer 6, the high voltage track 8 causes a significant disturbance in the electric field in the drift layer or region 7 of the device 1. In this case, there is severe crowding of the electric field at the junction between the drift region 7 and the relatively highly doped well 9 at the low voltage terminal end 3. This crowding of the electric field inevitably reduces the actual breakdown voltage of the device 1 from the theoretical value that would be obtained if a more uniform electric field were present in the drift layer.

A number of solutions to this problem have been proposed in the prior art. Referring for example to FIG. 4, it has been proposed to position plural polysilicon or metal, electrically floating, field plates 10 in the dielectric layer 6 above the low voltage terminal end 3 and at least the majority of the drift region 7. Such field plates 10 can alleviate the crowding of the electric field at the low voltage terminal end 3 of the drift region 7, but they are not always effective in ensuring a uniform distribution of potential inside the drift region 7.

Another solution proposed in the prior art is shown schematically in FIG. 5. In this example, several regions 11 (which may be provided in the form of rings) of relatively lowly doped layers of opposite polarity to the drift region 7 are implanted into the upper surface of the drift region 7 near the well 9 of the low voltage terminal end 3. The doping of the additional layers or rings 11 may decrease on moving away from the low voltage terminal end 3 towards the high voltage terminal end 2. The presence of these relatively lowly doped regions 11 tends to alleviate the crowding of the electric field at the end of the drift region 7 adjacent the low voltage terminal end 3. However, this inevitably requires extra fabrication steps in that the additional regions 11 have to be implanted. Moreover, the distribution of the potential lines in the drift region 7 is very sensitive to the doping of these additional regions 11 and also to any parasitic charge from the environment or that present inside the dielectric layers 4,6.

Another alternative solution is shown schematically in FIGS. 6 and 7. In this example, a trench 12 is etched into the semiconductor layer in which the drift region 7 is provided, the trench 12 extending between the high and low voltage terminal ends 2,3 longitudinally of the device 1 and extending partially laterally across the semiconductor layer in which the drift region 7 is provided so that the trench 12 is positioned under the high voltage track 8. The trench 12 is then filled with a dielectric 13. It has been found that this provides a very good solution to the problem of the high voltage track 8 affecting the electric field in the drift region 7. However, it is a fact that etching the semiconductor layer in which the drift region 7 is formed is a difficult process, as is filling a large trench 12 with dielectric material 13 followed by planarization which is typically required when fabricating a device 1 of this type. This manufacturing difficulty is exacerbated if the thickness of the semiconductor layer in which the drift region 7 is formed is relatively thick (say above 1 μm).

Reference may also be made to the following papers in which these and other techniques are discussed: *Junction Termination Extension for Near-Ideal Breakdown Voltage in p-n Junctions* by V. A. K. Temple and W. Tantraporn, IEEE Transactions on Electron Devices, Volume 33, Issue 10, October 1986, Pages 1601 to 1608; and *Optimization and Surface Charge Sensitivity of High-Voltage Blocking Structures with Shallow Junctions* by H. Yilmaz, IEEE Transactions on Electron Devices, Volume 38, Issue 7, July 1991, Pages 1666 to 1675.

According to a first aspect of the present invention, there is provided a high voltage/power semiconductor device, the device comprising:

a semiconductor layer;

the semiconductor layer having a high voltage terminal end for connection to a high voltage terminal;

the semiconductor layer having a low voltage terminal end for connection to a low voltage terminal;

the semiconductor layer having a drift region between the high and low voltage terminal ends of the semiconductor layer;

a dielectric layer above the drift region; and, an electrical conductor that extends across at least a part of the dielectric layer above the drift region, the electrical conductor being connected or connectable to the high voltage terminal end;

the drift region having plural trenches therein positioned below the electrical conductor, the trenches extending laterally across at least a part of the drift region in the direction transverse the direction between the high and low voltage terminal ends of the semiconductor layer, the trenches being longitudinally spaced apart from each other in the direction between the high and low voltage terminal ends of the semiconductor layer, each trench containing a dielectric material.

Each trench supports part of the voltage drop between the high and low voltage terminals that in use will be connected to the device. The trenches assist in ensuring that the electric field in the drift region is as uniform as possible in the presence of the electrical conductor (which is a high voltage track or interconnect, typically in the form of a metal track) that in use is connected to the high voltage terminal end, thus avoiding localised crowding of the electric field and thereby raising the breakdown voltage of the device. Positioning the trenches below the electrical conductor assists in ensuring that the electric field in the drift region is as uniform as possible in the presence of the electrical conductor.

In an embodiment, the width of at least some of said trenches in the direction transverse the direction between the high and low voltage terminal ends of the semiconductor layer is greater than the width of the electrical conductor in the direction transverse the direction between the high and low voltage terminal ends of the semiconductor layer.

In an embodiment, the semiconductor layer is provided on a dielectric layer that is provided on a semiconductor substrate.

In another embodiment, the semiconductor layer is provided on a dielectric layer, there being no semiconductor substrate below at least a portion of the drift region. This embodiment makes use of the "membrane" technology that is disclosed inter alia in our WO-A-02/25700, U.S. Pat. No. 6,703,684, U.S. Pat. No. 6,900,518, U.S. Pat. No. 6,927,102, U.S. Pat. No. 7,235,439 and US-A-2005-0242368, and related patents and patent applications, the entire contents of which are hereby incorporated by reference.

In an embodiment, the trenches are equally spaced from each other in the direction between the high and low voltage terminal ends of the semiconductor layer. This equal spacing makes the device relatively straightforward to manufacture.

In an embodiment, the length of each trench in the direction between the high and low voltage terminal ends of the semiconductor layer is the same. This equal length makes the device relatively straightforward to manufacture.

In an embodiment, the length of each trench in the direction between the high and low voltage terminal ends of the semiconductor layer increases from the low voltage terminal end to the high voltage terminal end. Increasing the length of the trenches towards the high voltage terminal end can be used to help ensure that the electric field peaks in each of the trenches is substantially the same, which helps to raise the breakdown voltage of the device.

In an embodiment, the spacing of the trenches from each other in the direction between the high and low voltage terminal ends of the semiconductor layer is non-uniform. This allows the size and position of the electric field peaks in the trenches to be tailored to optimise the shape of the electric field.

In an embodiment, the spacing of the trenches from each other in the direction between the high and low voltage terminal ends of the semiconductor layer increases from the low voltage terminal end to the high voltage terminal end. Increasing the spacing between the trenches towards the high voltage terminal end can be used to help ensure that the electric field peaks in each of the trenches is substantially the same, which helps to raise the breakdown voltage of the device.

In an embodiment, the length of each trench in the direction between the high and low voltage terminal ends of the semiconductor layer is the same. This equal length of the trenches makes the device relatively straightforward to manufacture.

In an embodiment, the length of each trench in the direction between the high and low voltage terminal ends of the semiconductor layer increases from the low voltage terminal end to the high voltage terminal end. Again, this helps ensure that the electric field peaks in each of the trenches is substantially the same, which helps to raise the breakdown voltage of the device.

In an embodiment, the device comprises a respective relatively highly doped region at the surface of the drift region between at least some of the trenches, each of said relatively highly doped regions having a doping polarity that is opposite that of the drift region. These regions effectively act like field-limiting rings which serve to better distribute the voltage drop across the drift region.

In an embodiment, the device comprises one or more field plates in a dielectric layer above the drift region, the one or more field plates being positioned above one or more of said trenches. These one or more field plates serve to assist in making the electric field in the drift region as uniform as possible in the presence of a track or interconnect that in use is connected to the high voltage terminal end.

In an embodiment, at least some of the trenches have a non-linear shape in the direction transverse the direction between the high and low voltage terminal ends of the semiconductor layer. In effect, the shapes of the trenches can be tailored to improve the uniformity of the electric field in the drift region in the presence of a track or interconnect that in use is connected to the high voltage terminal end.

According to a second aspect of the present invention, there is provided a method of forming a high voltage/power semiconductor device having a semiconductor layer, the semiconductor layer having a high voltage terminal end for connection to a high voltage terminal, the semiconductor layer having a low voltage terminal end for connection to a low voltage terminal, the semiconductor layer having a drift region between the high and low voltage terminal ends of the semiconductor layer, the semiconductor layer having a dielectric layer above the drift region, and the semiconductor layer having an electrical conductor that extends across at least a part of the dielectric layer above the drift region, the electrical conductor being connected or connectable to the high voltage terminal end; the method comprising:

forming plural trenches in the drift region below the electrical conductor such that the trenches extend laterally across at least a part of the drift region in the direction transverse the direction between the high and low voltage terminal ends of the semiconductor layer and such that the trenches are longitudinally spaced apart from each other in the direction between the high and low voltage terminal ends of the semiconductor layer; and, filling each trench with a dielectric material.

In an embodiment, the width of at least some of said trenches in the direction transverse the direction between the high and low voltage terminal ends of the semiconductor layer is greater than the width of the electrical conductor in the direction transverse the direction between the high and low voltage terminal ends of the semiconductor layer.

In an embodiment, the method comprises forming a respective relatively highly doped region at the surface of the drift region between at least some of the trenches, each of said relatively highly doped regions having a doping polarity that is opposite that of the drift region.

In an embodiment, said relatively highly doped regions are formed in the same process step as other CMOS regions of the device.

In an embodiment, the method comprises providing one or more field plates in a dielectric layer above the drift region, the one or more field plates being positioned above one or more of said trenches.

Embodiments of the present invention will now be described by way of example with reference to the accompanying drawings, in which.

Figure 14:
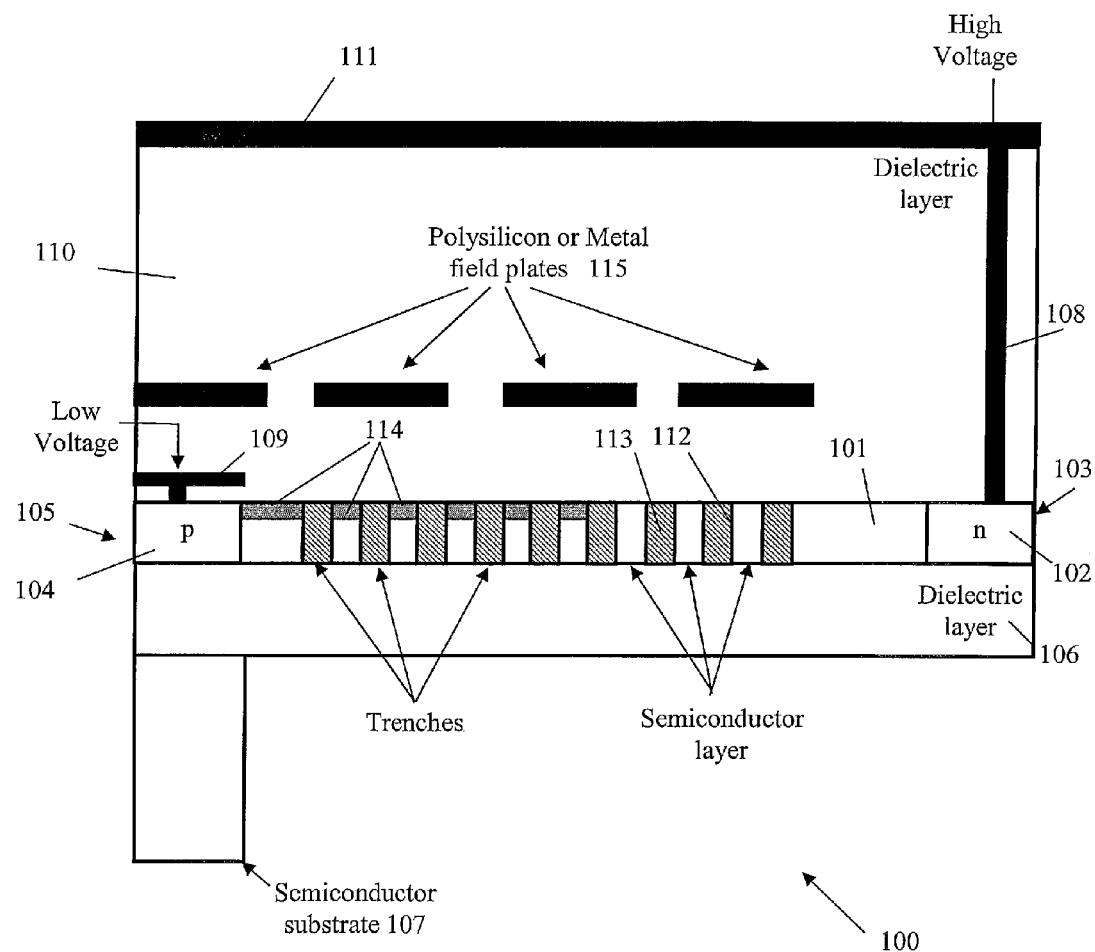
Figure 15:
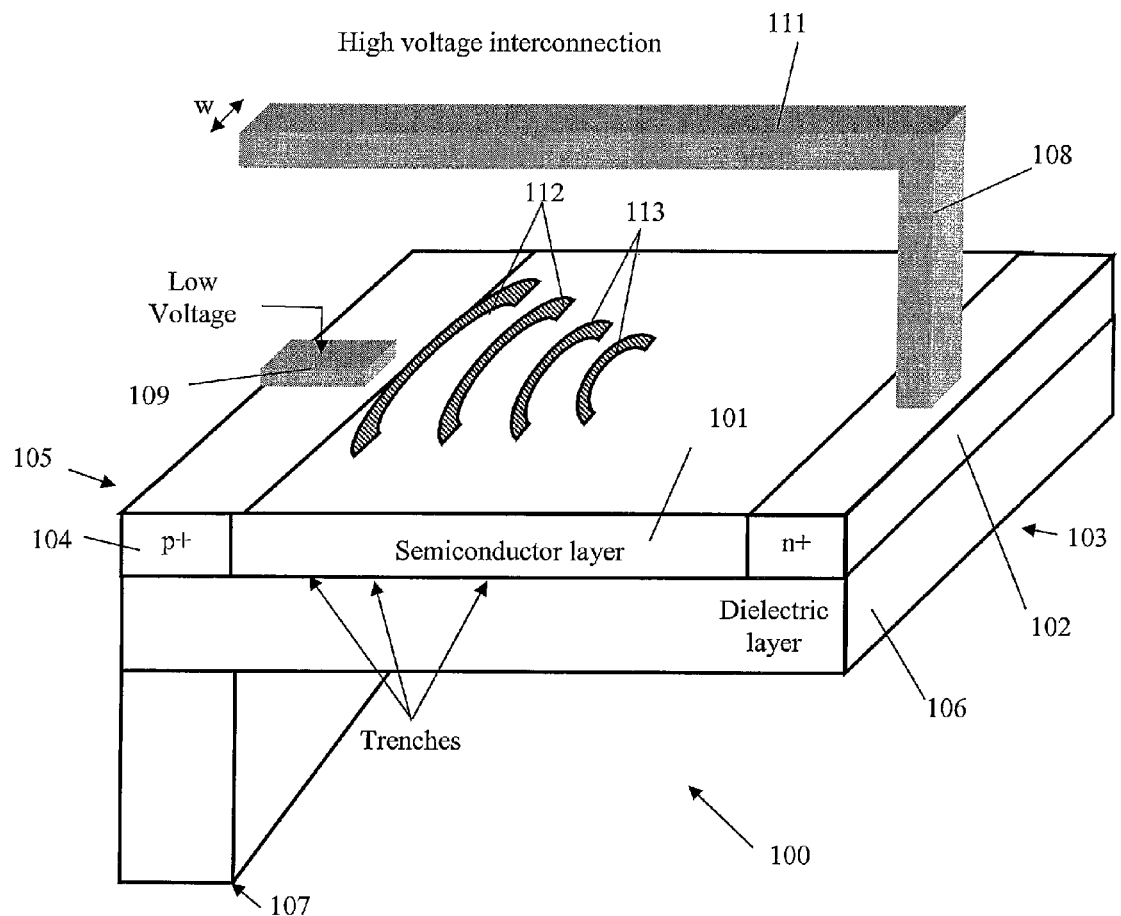
Figure 16:
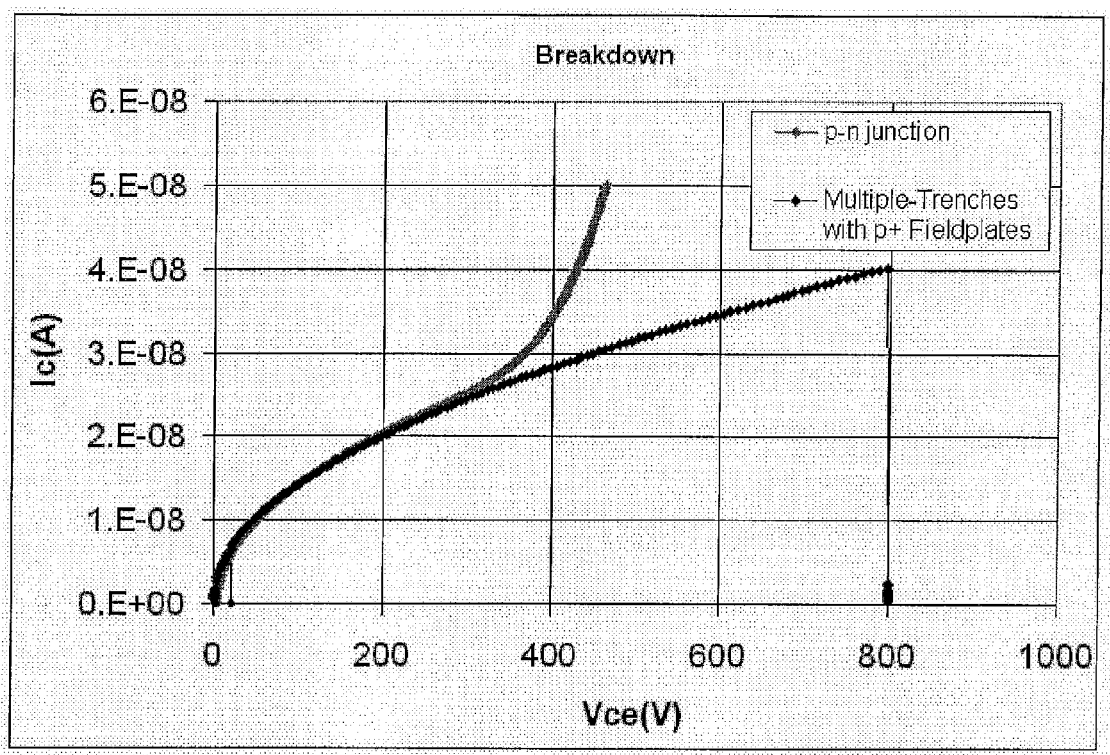

FIGS. 10 to 15 respectively show schematically further different examples of devices according to embodiments of the present invention; and, FIG. 16 shows a comparison of the breakdown I-V characteristics of an example of a device in accordance with an embodiment of the present invention compared with a prior art device.

In the following description, similar parts and regions in the various examples described have the same reference numerals.

Figure 1:
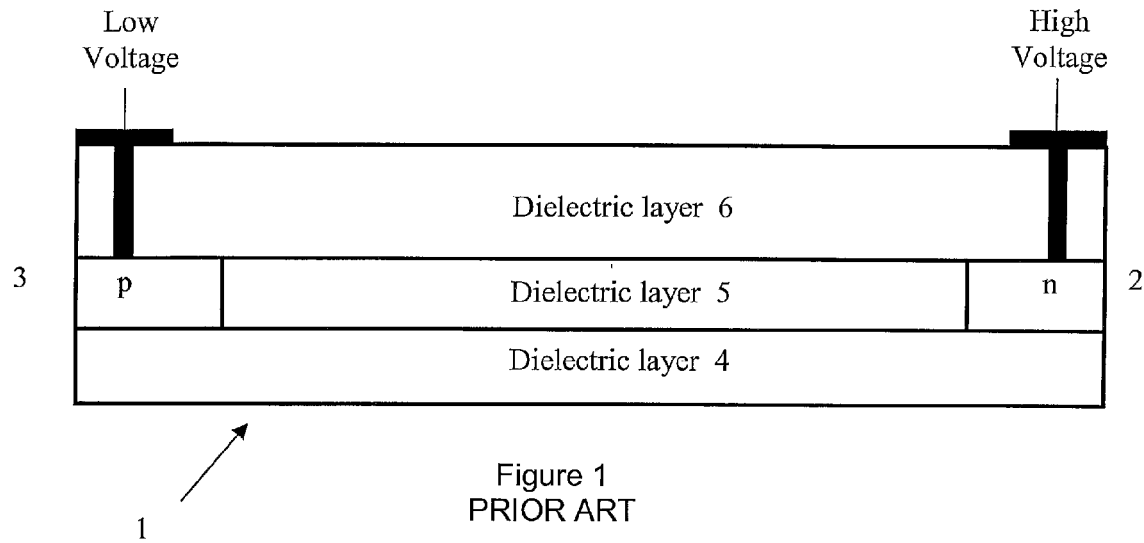
FIGS. 1 to 7 show schematically examples of prior art devices.
Figure 2:
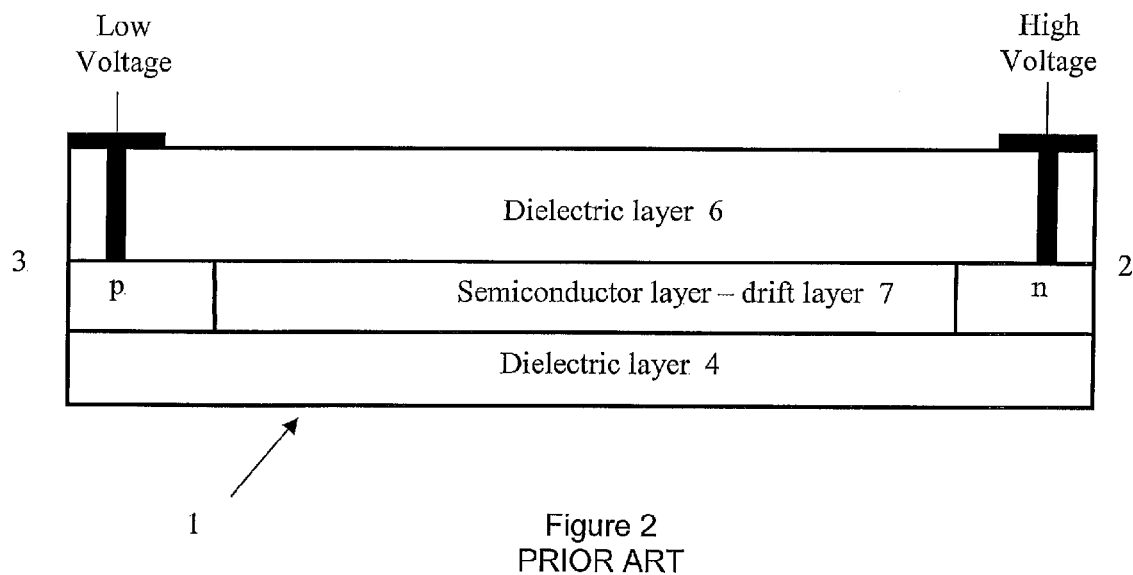
Figure 3:
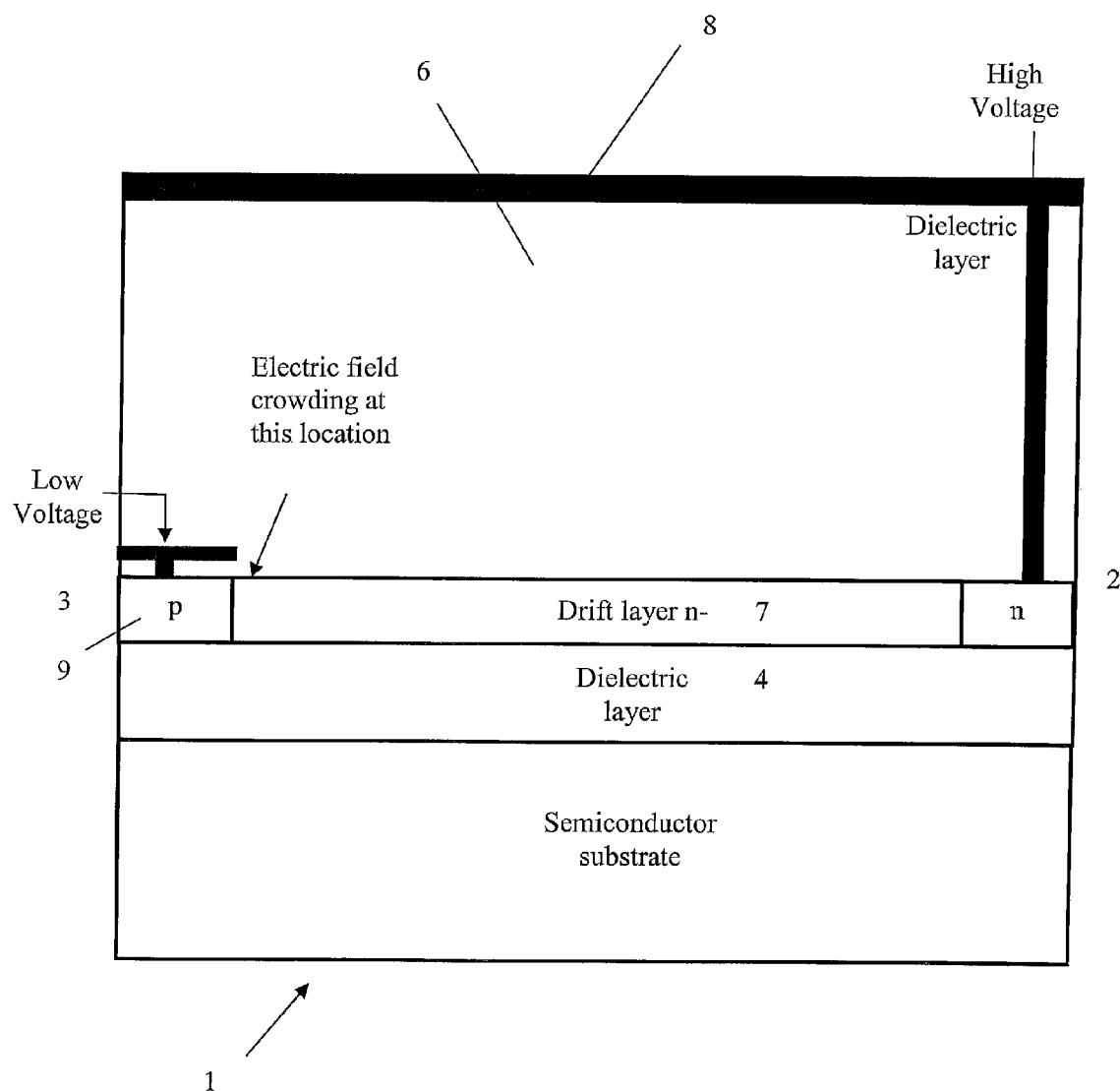
Figure 4:
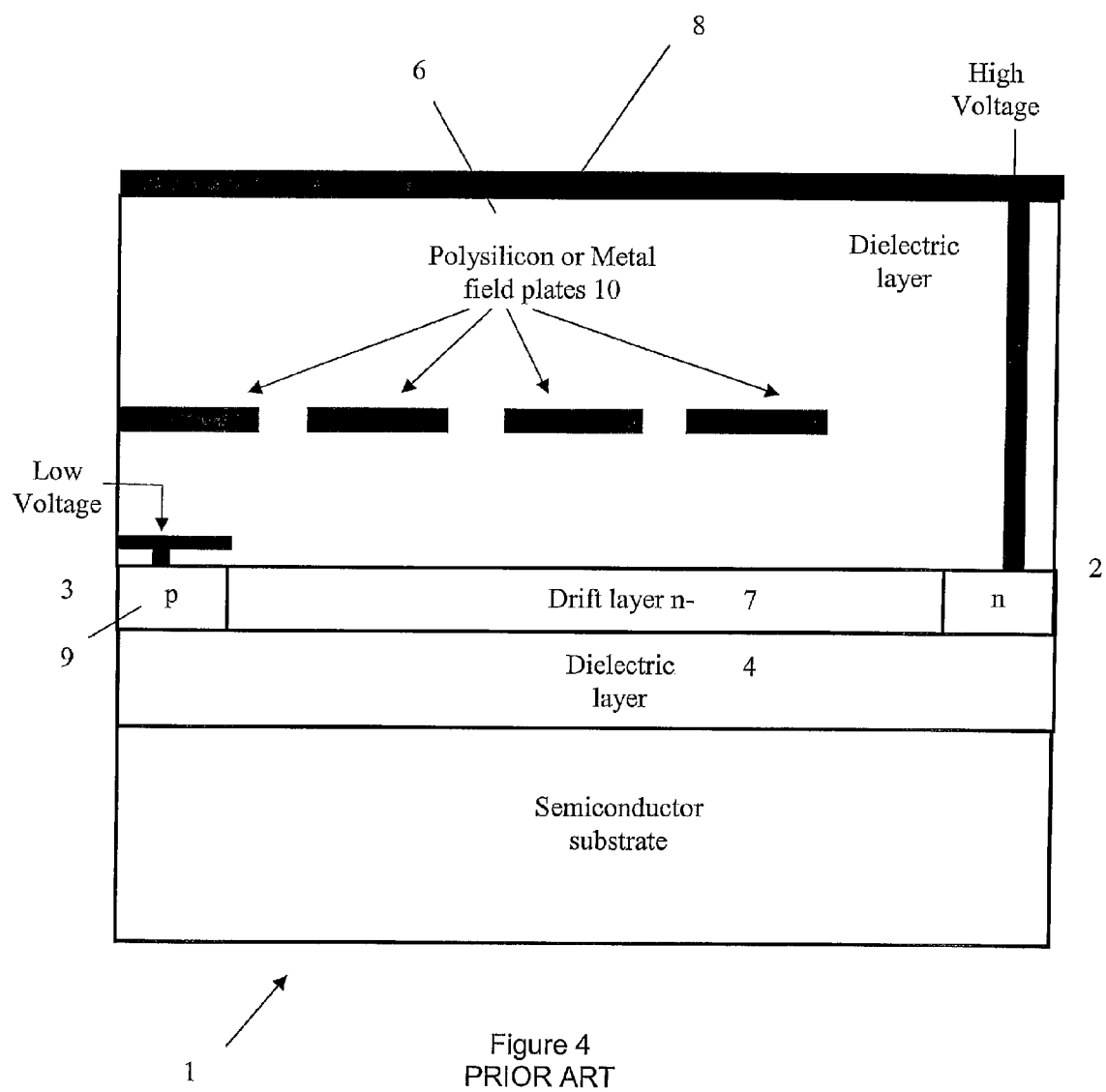
Figure 5:
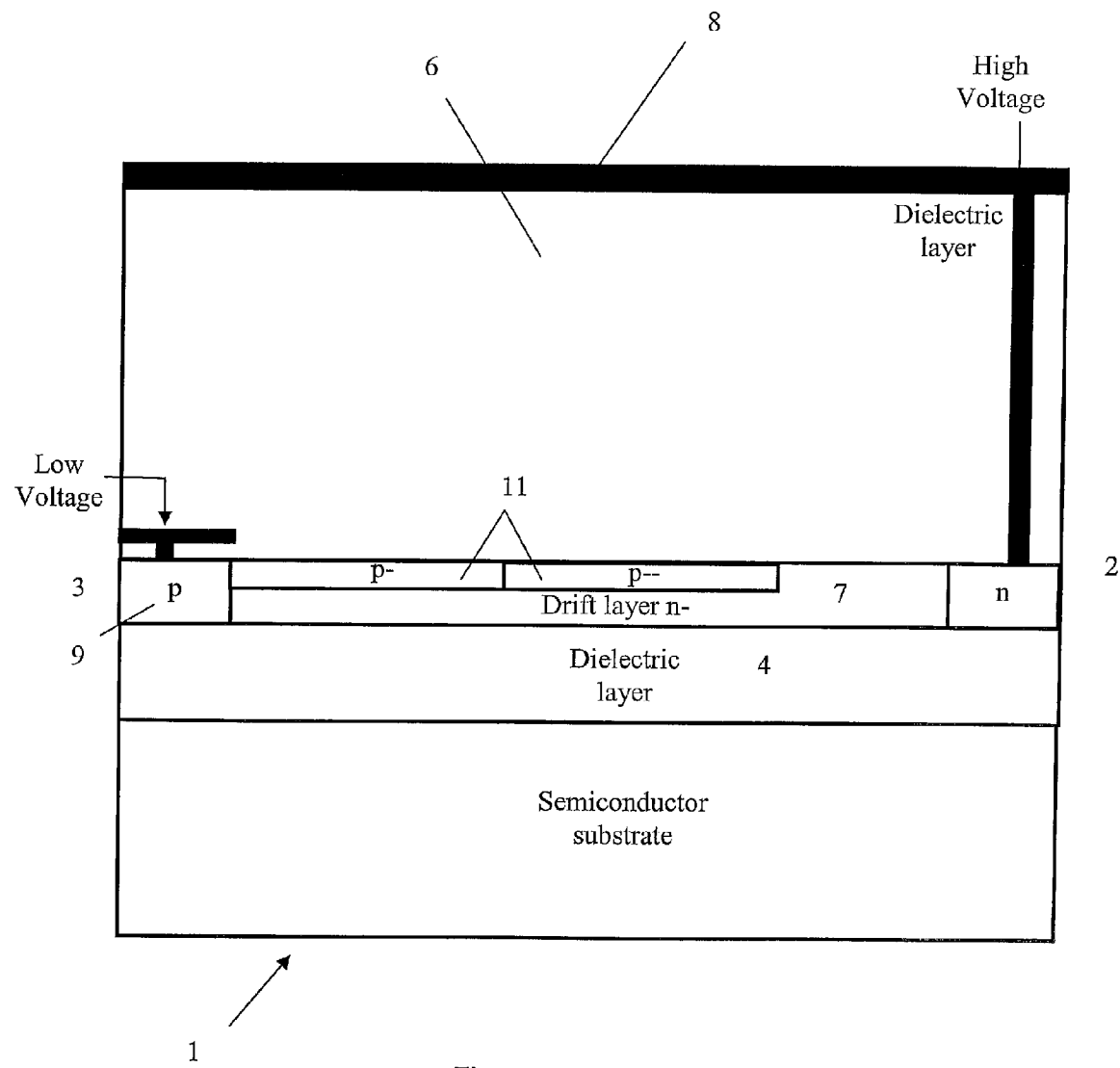
Figure 6:
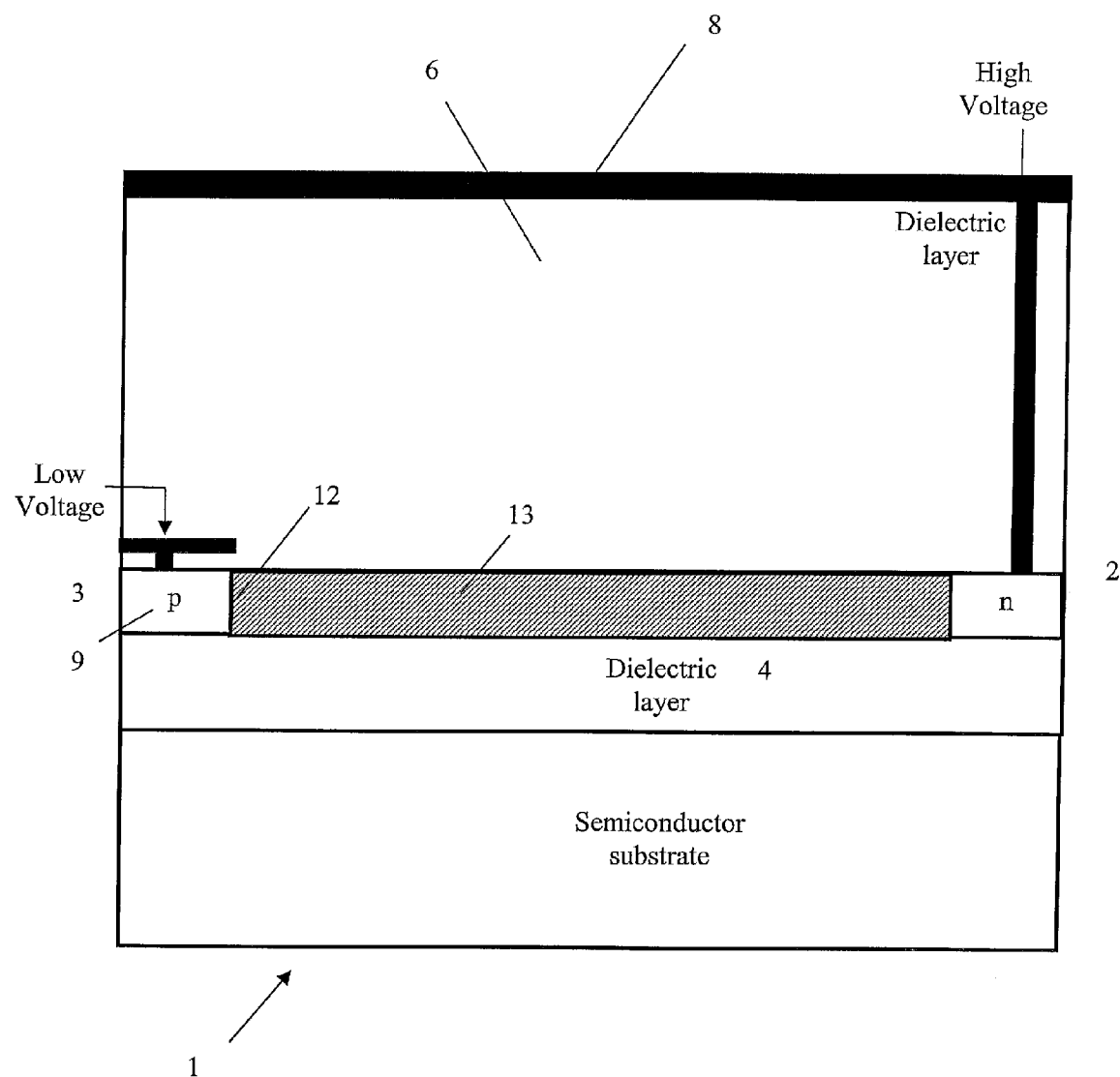
Figure 7:
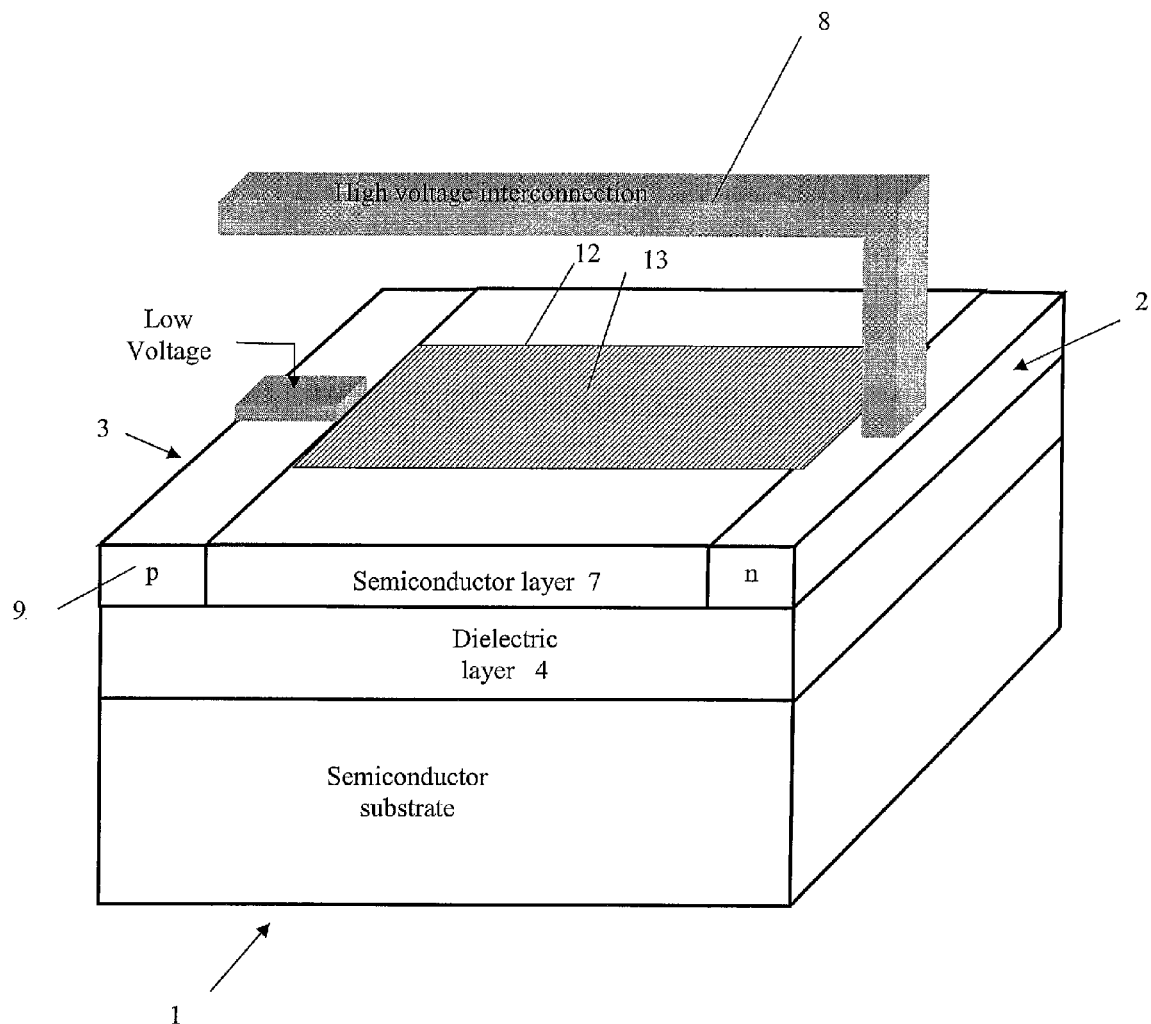
Figure 8:
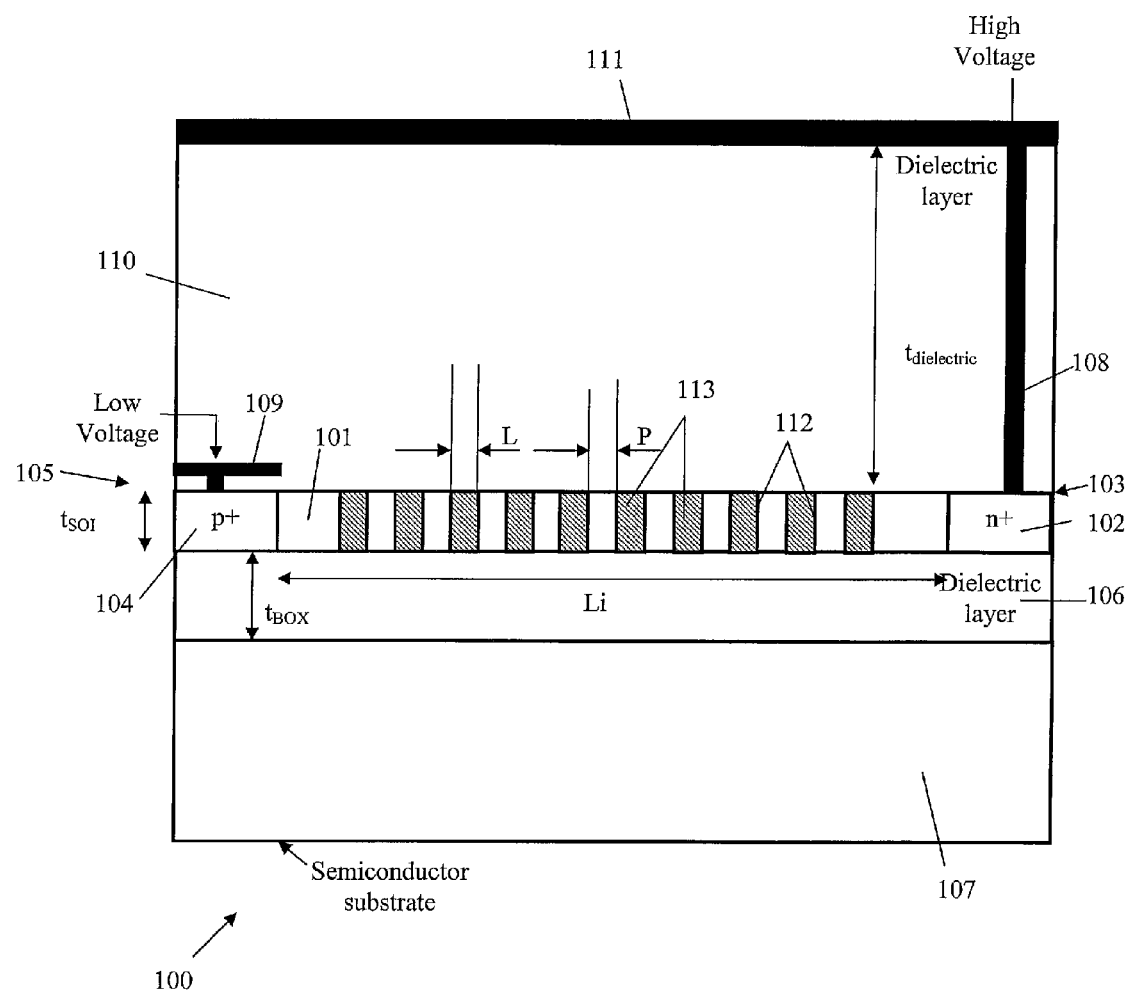
FIG. 8 show schematically an example of a device according to an embodiment of the present invention.

Referring first to FIG. 8, there is shown schematically a cross-sectional view of a high voltage/power semiconductor device 100. Being for high voltage/power applications, the device 100 has a semiconductor-layer 101 that is lowly doped so as to provide a drift region 101. The example shown is a simple diode 101 and therefore, in this case, an n+ well 102 is formed at the high voltage terminal end 103 and a p+ well 104 is provided at the low voltage terminal end 105, the drift region 101 in this case being n-type. This particular example uses silicon-on-insulator (SOI) technology and thus the drift region 101 and n+ well 102 and p+ well 104 are formed on a dielectric layer 106 which, in this example, is itself formed on a semiconductor substrate 107. A high voltage terminal 108 is connected to the n+ well 102. Correspondingly, a low voltage terminal 109 is connected to the p+ well 104. A dielectric layer 110 is formed above the drift region 101 and n+ and p+ wells 102,104.

A metal high voltage track or interconnect 111 is formed over the upper dielectric layer 110 and is in use connected to the high voltage terminal 108. The track 111 overlies the drift region 102. As described above, the presence of this high voltage track 111 can disrupt the electric field arising in the drift region 101 when a high voltage is supported across the drift region 101, which causes crowding of the electric field lines. This crowding of the electric field lines is minimised in this embodiment by providing plural trenches 112, each filled with a dielectric 113, in the drift region 101. The dielectric 113 is typically silicon dioxide (oxide), but silicon nitride or oxynitride, or any combination thereof, may be used.

Each trench 112 supports some of the voltage drop between the high voltage and low voltage terminals 108,109 and assists in distributing the electric field lines more evenly over the drift region, thereby avoiding crowding of the field lines and thus increasing the breakdown voltage of the device 100.

Figure 9:
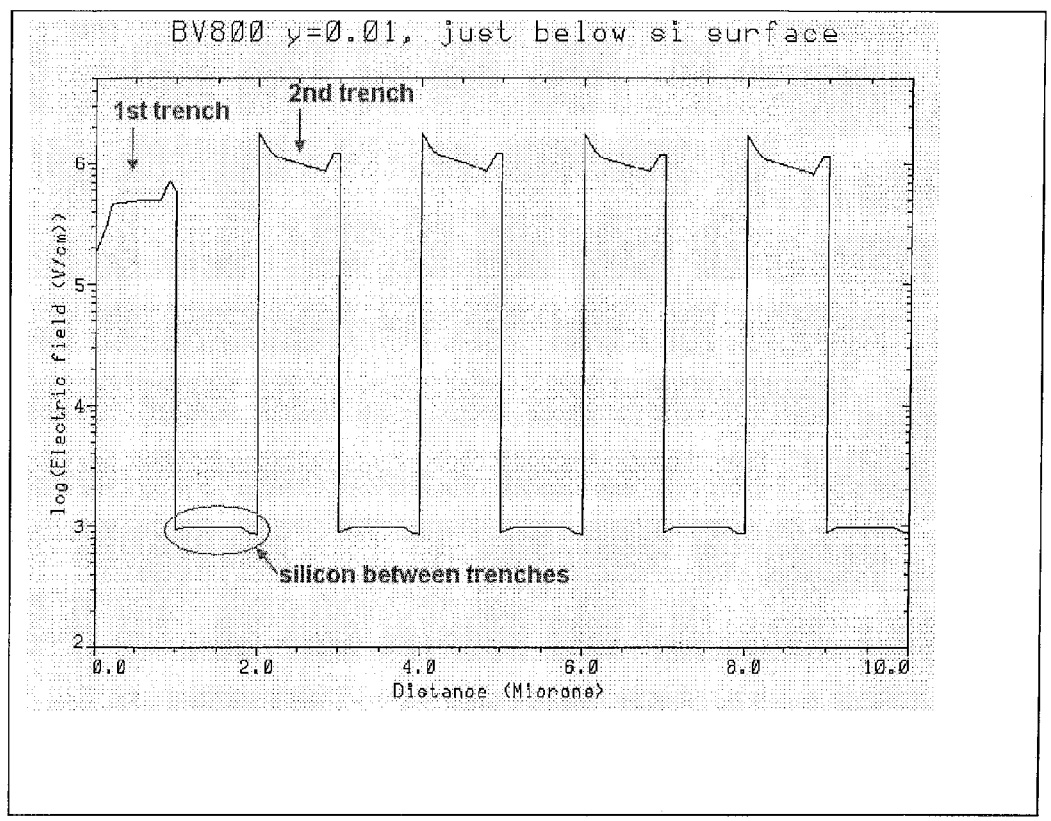
FIG. 9 shows the distribution of the surface electric field inside the drift region below the high voltage interconnection metal track in the example of FIG. 8.

FIG. 9 shows the distribution of the surface electric field inside the drift region 101 below the high voltage interconnection metal track 111 as based on a numerical simulation. There is shown the electric field inside the silicon drift region 101 and that inside the first five trenches 112, with the first trench 112 being the closest to the p+ region 104. Ideally, the electric field level in each of the trenches 112 would be the same, so that for the same trench length L (as in FIG. 8), the potential drop inside each trench 112 would be the same. In practice, however, there is some variation of the electric field from trench 112 to trench 112. Further optimisation of the geometry of the trenches 112 and pitch between trenches 112 can therefore be carried out. FIG. 9 also shows that most of the potential is dropped inside the trenches 112 rather than between the trenches 112 for example.

In the example shown in FIG. 8, the length L of each trench 112 (measured in the direction longitudinally of the device between the high voltage and low voltage terminals 108,109) is the same. Similarly, the spacing or pitch P between the trenches 112 in this direction is the same.

The device 100 shown in FIG. 8 is a 800V rated device (i.e. with a desired breakdown voltage in excess of 800 V). The length of the interconnect or track 111 may be between 50 to 150 microns. In this example, ten trenches 112 are provided, each trench 112 carrying approximately 60V. The trench length L may be between 0.5 to 2 microns. The spacing P may be between 2 to 10 microns. As mentioned, the distance P between the trenches 112 and the length L of the trenches are both constant in this example, but this can be varied to obtain a more equal distribution of the voltage in each of the trench rings as discussed further below. The thickness $t_{dielectric}$ of the upper dielectric layer 110 may be in the region of 3 to 6 microns. The semiconductor layer 101 between the trenches 112 in this example is of n type doping with an average doping concentration of between $10^{16}$ cm$^{-3}$ to $10^{20}$ cm$^{-3}$. This layer 101 is not depleted at 600 V and the potential drop across it is minimal (most of the potential being dropped in the trenches 112 rather than between the trench rings). The thickness $t_{BOX}$ of the buried oxide layer 106 may be between 1 to 4 microns. The thickness $t_{SOI}$ of the semiconductor layer 101 may vary very significantly from 0.2 microns to 20 microns depending on the type of SOI technology (thin, medium or thick). Typically, for power ICs, the thickness $t_{SOI}$ of the semiconductor layer 101 may be in the range of 1 to 20 microns. The semiconductor substrate 107 can be of p-type or n-type, its doping having very little influence on the potential/electric field distribution within the device. The p+ and n+ wells 102, 104 are typically highly doped, for example in excess of $10^{20}$ cm$^{-3}$.

Figure 10:
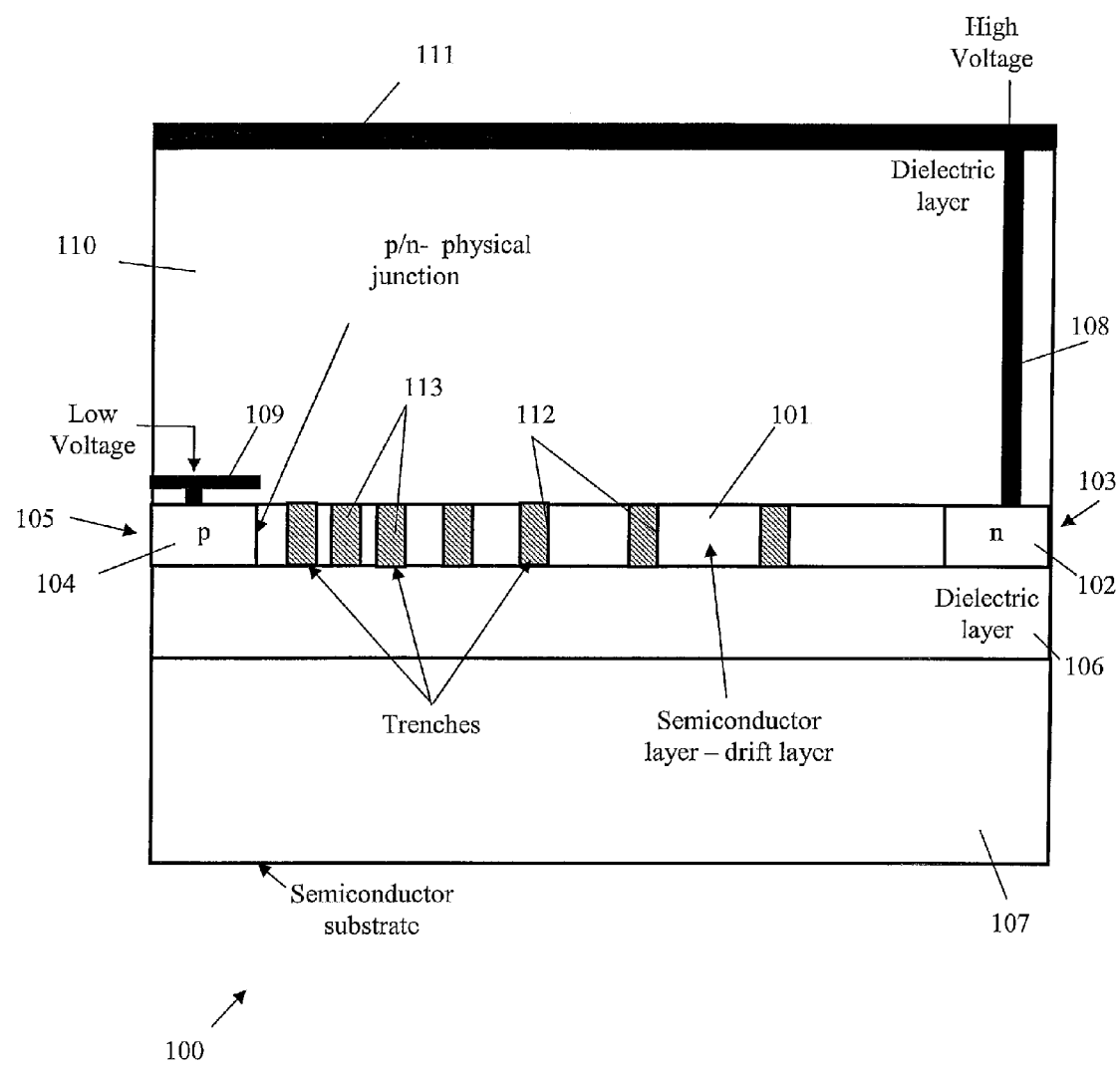

In the example shown in FIG. 10, the length L of the trenches 112 is the same for each trench 112. However, the spacing or pitch P between the trenches 112 varies so as to optimise the shape of the electric field in the drift region 101. In the example shown in FIG. 10, the spacing P between the trenches 112 increases gradually on going from the low voltage end 105 to the high voltage end 103. This helps to ensure that the peaks of the electric field in each of the trenches 112 is at the same, or substantially the same, level. The optimum spacing P between the trenches 112 can be determined depending on the width of the track 111 in the third dimension (into the paper of the drawing of FIG. 10, the shape of the n and p wells 102,104, the doping of the drift region 101, and the shape of the trenches 112 in the third dimension (into the paper of FIG. 10).

Figure 11:
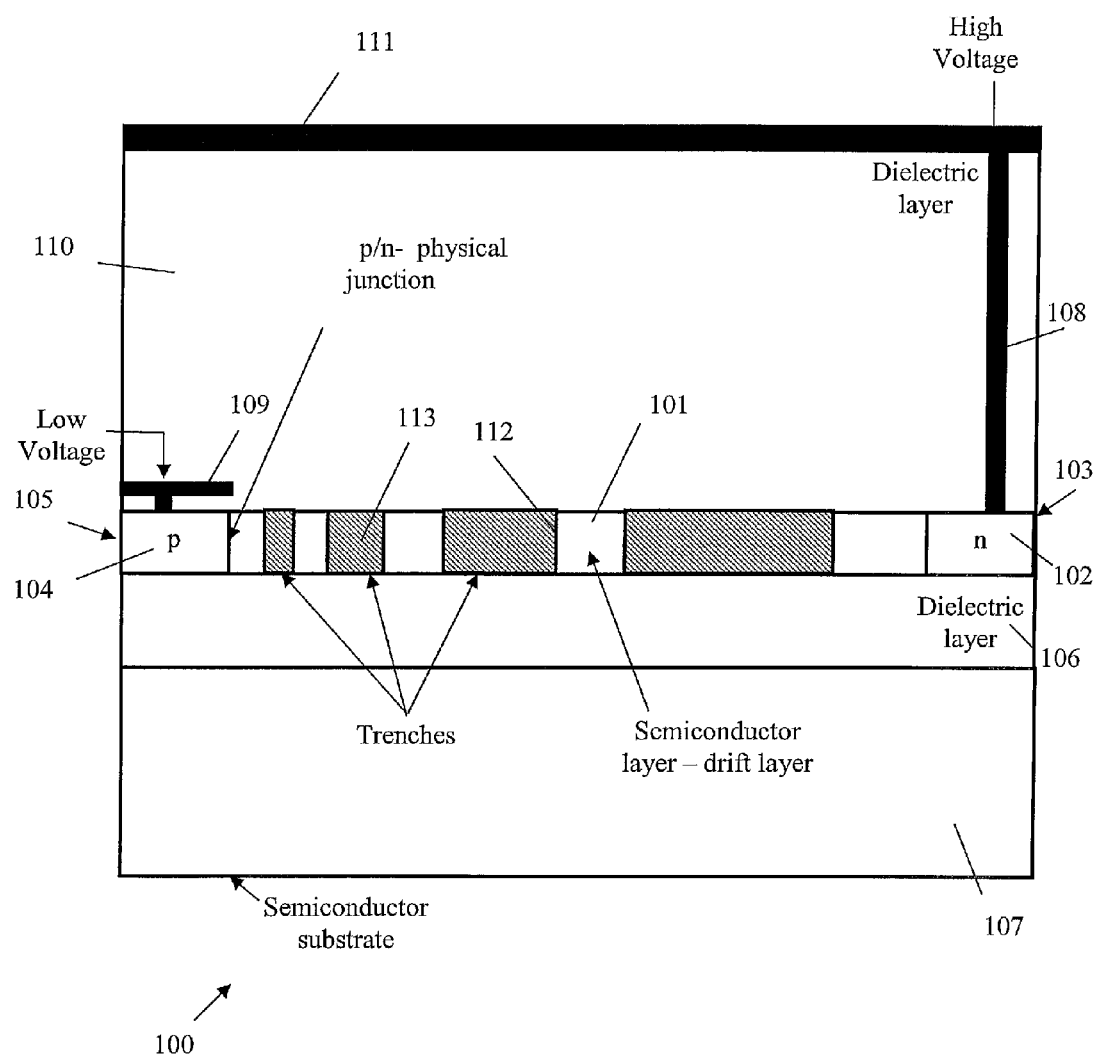

In the example shown in FIG. 11, not only does the spacing P between the trenches 112 increase in the direction going from the low voltage end 105 to the high voltage end 102 of the device 100, but also the length L of the trenches 112 also increases in this direction. In other words, the length of each trench 112 is greater towards the high voltage end 103. Again, this helps to distribute the electric field more evenly amongst the trenches 112.

It will be appreciated that in another example (not shown), the length of the trenches 112 may increase towards the high voltage end 103, but the spacing P between the trenches 112 may be constant.

Figure 12:
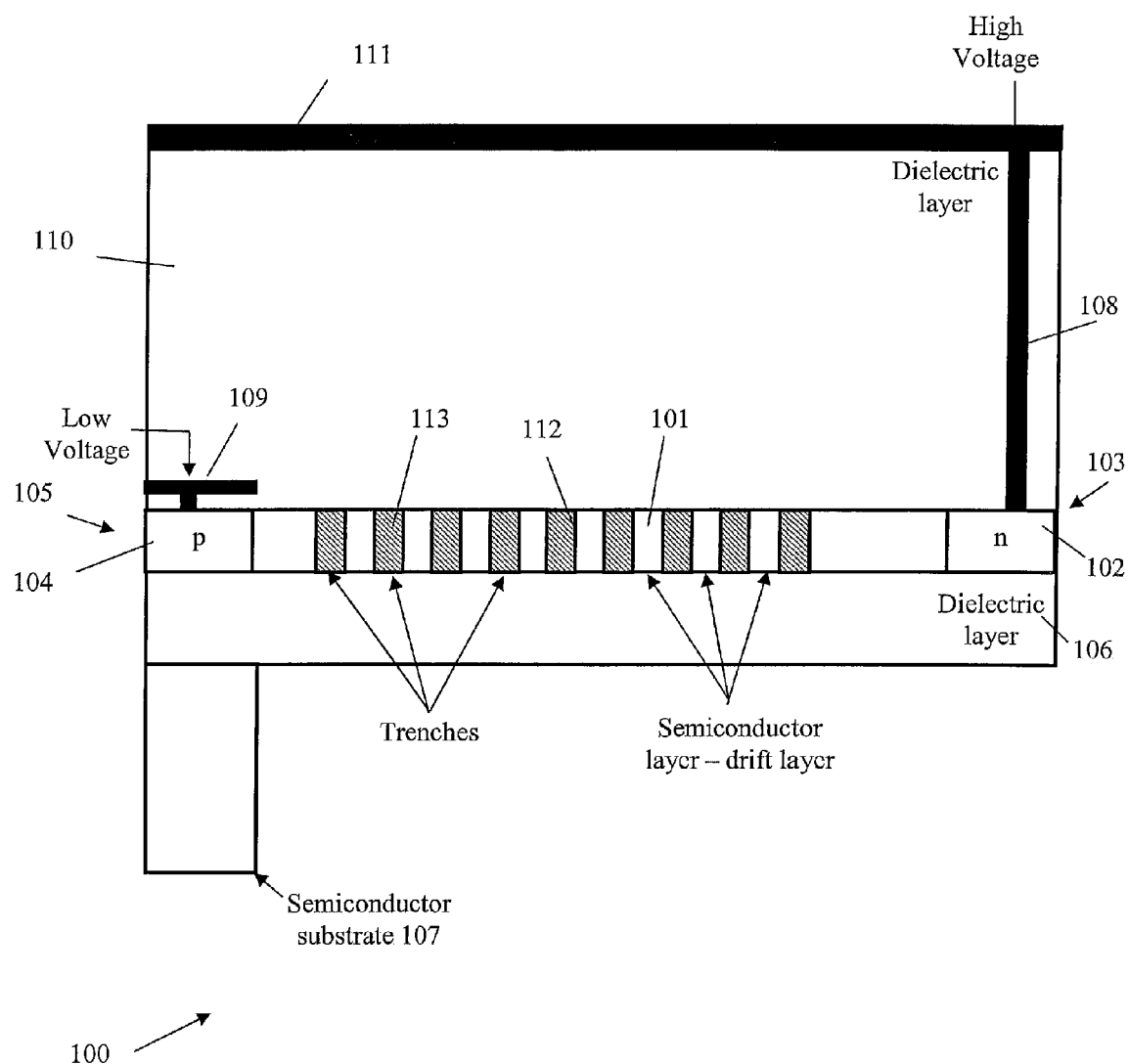

The example shown in FIG. 12 uses the so-called membrane technology referred to above. Accordingly, in this example, a portion of the semiconductor substrate 107 below at least a part and preferably the whole of the drift region 101 is removed or otherwise absent. As described more fully in our patents and patent applications referenced above, in a lateral device such as is shown in FIG. 12, the membrane technology helps to ensure that the potential lines in the drift region 101 are substantially perpendicular to the top and bottom surfaces of the membrane that is effectively formed by the drift region 101 and that the potential lines are spread substantially uniformly across the drift region 101 between the high and low voltage ends 103,105. This again improves the breakdown voltage of the device 100.

Figure 13:
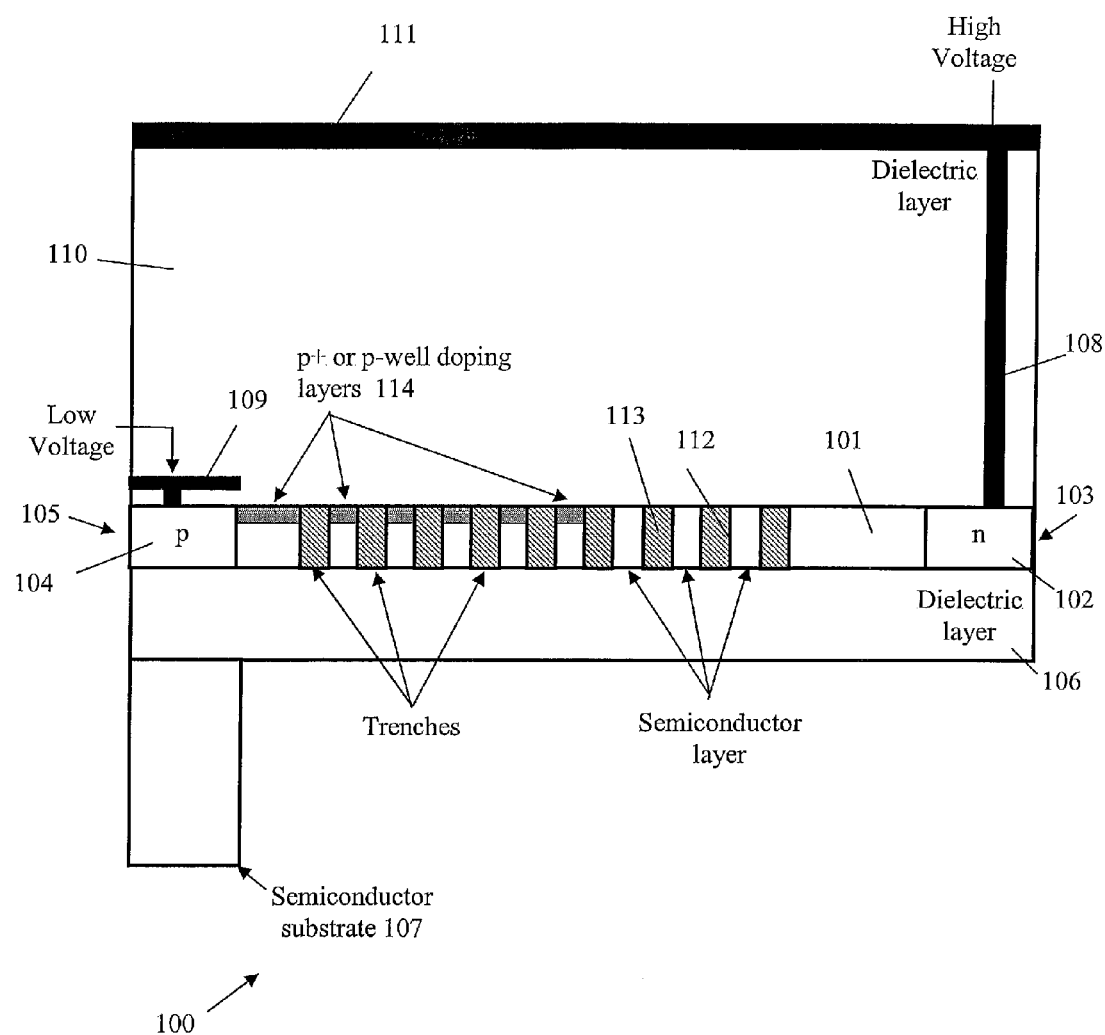

In the example shown in FIG. 13, p+ or p− surface implants are placed at the upper surface of the drift layer 101 between some or all of the trenches 112. These implants 114 act as field rings which push the voltage into the trenches 112, again increasing the breakdown voltage of the device 100. It may be noted that these implants 114 can be introduced during the CMOS processing steps that will typically be carried out (such as to produce the p+ source/drain of a CMOS p-channel transistor or the p-well of a CMOS n-channel transistor) and therefore no additional processing step is required merely to introduce the implants 114.

It should be noted that while the specific example shown in FIG. 13 uses the membrane technology discussed above in connection with FIG. 12, the implants 114 can be used with any of the examples described in the present application.

In the example shown in FIG. 14, polysilicon or metal field plates 115 are introduced into the upper dielectric layer 110 in a position generally above the trenches 112. These field plates 115 are electrically floating and further help the uniform distribution of the electric field lines, thus improving the breakdown voltage of the device 100. The location of the field plates 115 relative to the trenches 112, and the shape and size of the field plates 115, may be optimised in order to reduce the crowding of the electric field lines and thus improve the breakdown voltage. As above, the example specifically shown in FIG. 14 uses the membrane technology discussed above, but this is not a requirement and instead a full substrate 107 may be used under the dielectric layer 106.

FIG. 15 shows a schematic perspective view of an example of a device according to an embodiment of the present invention. This perspective view shows the extent and shape of an example of the trenches 112 in the third dimension (i.e. into the paper of the other Figures). Only four trenches 112 are shown in FIG. 15 for reasons of clarity. A number of points should be noted here. First, the width of the trenches 112 (i.e. their dimension in a direction transverse to the length of the device 100 between the low voltage end 105 and the high voltage end 103) is greater than the corresponding width w of the interconnect 111. Indeed, it is preferred that the width of the trenches 112 be much greater than the width w of the track 111, for example and without limitation at least three times wider, and perhaps five or ten times or more wider for example. Secondly, whilst the trenches 112 may be rectilinear, different shapes for the trenches 112 in the third dimension may be used. Thus, for example, the trenches 112 may be non-linear across the width of the device 100. In the specific example shown in FIG. 15, the trenches 112 have a generally crescent shape in this third dimension. Moreover, in this example, the width of the trenches 112 decreases towards the high voltage end 103. As with other dimensions of various components of the device 100, the shape, size and position of the trenches 112 may be optimised for a particular device 100 in order to ensure that the electric field lines are as uniform as possible. The doping, size, shape and location of the various other regions and parts of the device 100 are factors that will determine the best shape, size and location of the trenches 112. In general, it is preferred that the trenches 112 do not have sharp corners and instead have rounded corners in order to prevent a high electric field forming at the corners of the trenches 112.

Referring briefly to FIG. 16, a comparison of the breakdown voltage of a prior art device having a simple p-n junction with no multiple trenches and an example of a device 100 according to the present invention having multiple trenches and, in this case, field plates, is shown. As can be seen, the prior art device has a breakdown voltage somewhat less than 500V whereas the breakdown voltage of the specific example of the present invention is 800V or more.

In summary, the provision of multiple trenches in the drift region, in which the trenches are filled with dielectric, serves to alleviate crowding of the electric field lines and thus increases the breakdown voltage of the device 100. As already mentioned, in any of the examples described above, the trenches may have the same or a different length, the same or a different spacing, the same or a different width, and may be linear or non-linear in the third dimension. The device 100 may or may not use the membrane technology discussed above. In each of the examples described above, surface implants 114 and/or field plates 115 in the upper dielectric layer 110 may be used.

The particular device 100 may be one of many different types. The device 100 may for example be a relatively simple diode, a transistor, thyristor or the like, or may be a LIGBT (Lateral Insulated Gate Bipolar Transistor), a LDMOSFET (Laterally Diffused Metal-Oxide-Semiconductor Field Effect Transistor), etc. A particular example in which a high voltage track 111 is present is in the case where the device 100 provides one switch of multiple switches in a high voltage/power integrated circuit. If for example one device 100 is connected in a high side configuration with the gate of the device 100 effectively floating to a high voltage, the connection for this gate to the low voltage circuit is typically made through a metal track that traverses a region of high electric field.

Embodiments of the present invention have been described with particular reference to the examples illustrated. However, it will be appreciated that variations and modifications may be made to the examples described within the scope of the present invention.

The invention claimed is:

1. A high voltage/power semiconductor device, the device comprising:
   a semiconductor layer;
   the semiconductor layer having a high voltage terminal end for connection to a high voltage terminal;
   the semiconductor layer having a low voltage terminal end for connection to a low voltage terminal;
   the semiconductor layer having a drift region between the high and low voltage terminal ends of the semiconductor layer;
   a dielectric layer above the drift region; and,
   an electrical conductor that extends across at least a part of the dielectric layer above the drift region, the electrical conductor being connected or connectable to the high voltage terminal end;
   the drift region having plural trenches therein positioned below the electrical conductor, the trenches extending laterally across at least a part of the drift region in the direction transverse the direction between the high and low voltage terminal ends of the semiconductor layer, the trenches being longitudinally spaced apart from each other in the direction between the high and low voltage terminal ends of the semiconductor layer, each trench containing a dielectric material.

2. A device according to claim 1, wherein the width of at least some of said trenches in the direction transverse the direction between the high and low voltage terminal ends of the semiconductor layer is greater than the width of the electrical conductor in the direction transverse the direction between the high and low voltage terminal ends of the semiconductor layer.

3. A device according to claim 1, wherein the semiconductor layer is provided on a dielectric layer that is provided on a semiconductor substrate.

4. A device according to claim 1, wherein the semiconductor layer is provided on a dielectric layer, there being no semiconductor substrate below at least a portion of the drift region.

5. A device according to claim 1, wherein the trenches are equally spaced from each other in the direction between the high and low voltage terminal ends of the semiconductor layer.

6. A device according to claim 1, wherein the length of each trench in the direction between the high and low voltage terminal ends of the semiconductor layer is the same.

7. A device according to claim 1, wherein the length of each trench in the direction between the high and low voltage terminal ends of the semiconductor layer increases from the low voltage terminal end to the high voltage terminal end.

8. A device according to claim 1, wherein the spacing of the trenches from each other in the direction between the high and low voltage terminal ends of the semiconductor layer is non-uniform.

9. A device according to claim 8, wherein the spacing of the trenches from each other in the direction between the high and low voltage terminal ends of the semiconductor layer increases from the low voltage terminal end to the high voltage terminal end.

10. A device according to claim 8, wherein the length of each trench in the direction between the high and low voltage terminal ends of the semiconductor layer is the same.

11. A device according to claim 8, wherein the length of each trench in the direction between the high and low voltage terminal ends of the semiconductor layer increases from the low voltage terminal end to the high voltage terminal end.

12. A device according to claim 1, comprising a respective relatively highly doped region at the surface of the drift region between at least some of the trenches, each of said relatively highly doped regions having a doping polarity that is opposite that of the drift region.

13. A device according to claim 1, comprising one or more field plates in a dielectric layer above the drift region, the one or more field plates being positioned above one or more of said trenches.

14. A device according to claim 1, wherein at least some of the trenches have a non-linear shape in the direction transverse the direction between the high and low voltage terminal ends of the semiconductor layer.

15. A method of forming a high voltage/power semiconductor device having a semiconductor layer, the semiconductor layer having a high voltage terminal end for connection to a high voltage terminal, the semiconductor layer having a low voltage terminal end for connection to a low voltage terminal, the semiconductor layer having a drift region between the high and low voltage terminal ends of the semiconductor layer, the semiconductor layer having a dielectric layer above the drift region, and the semiconductor layer having an electrical conductor that extends across at least a part of the dielectric layer above the drift region, the electrical conductor being connected or connectable to the high voltage terminal end; the method comprising:
    forming plural trenches in the drift region below the electrical conductor such that the trenches extend laterally across at least a part of the drift region in the direction transverse the direction between the high and low voltage terminal ends of the semiconductor layer and such that the trenches are longitudinally spaced apart from each other in the direction between the high and low voltage terminal ends of the semiconductor layer; and,
    filling each trench with a dielectric material.

16. A method according to claim 15, wherein the width of at least some of said trenches in the direction transverse the direction between the high and low voltage terminal ends of the semiconductor layer is greater than the width of the electrical conductor in the direction transverse the direction between the high and low voltage terminal ends of the semiconductor layer.

17. A method according to claim 15, comprising forming a respective relatively highly doped region at the surface of the drift region between at least some of the trenches, each of said relatively highly doped regions having a doping polarity that is opposite that of the drift region.

18. A method according to claim 17, wherein said relatively highly doped regions are formed in the same process step as other CMOS regions of the device.

19. A method according to claim 15, comprising providing one or more field plates in a dielectric layer above the drift region, the one or more field plates being positioned above one or more of said trenches.

* * * * *